(12) United States Patent
Koberg

(10) Patent No.: US 9,016,200 B2
(45) Date of Patent: Apr. 28, 2015

(54) METHOD AND APPARATUS TO POSITION AND ALIGN PRE-PUNCHED PRINTING PLATES ON AN IMAGING CYLINDER

(71) Applicant: Esko-Graphics Imaging GmbH, Itzehoe (DE)

(72) Inventor: Jörg Koberg, Itzehoe (DE)

(73) Assignee: Esko-Graphics Imaging, GmbH, Itzehoe (DE)

( * ) Notice: Subject to any disclaimer, the term of this patent is extended or adjusted under 35 U.S.C. 154(b) by 48 days.

(21) Appl. No.: 13/870,903

(22) Filed: Apr. 25, 2013

(65) Prior Publication Data

US 2013/0284041 A1 Oct. 31, 2013

Related U.S. Application Data

(60) Provisional application No. 61/639,694, filed on Apr. 27, 2012.

(51) Int. Cl.
*B41F 3/08* (2006.01)
*B41F 1/34* (2006.01)
*B41C 1/18* (2006.01)
*G03F 7/24* (2006.01)

(52) U.S. Cl.
CPC ... *B41C 1/18* (2013.01); *G03F 7/24* (2013.01); *Y10S 101/36* (2013.01)

(58) Field of Classification Search
USPC ............ 101/382.1, 383, 415.1, 486, DIG. 36; 33/618, 621
See application file for complete search history.

(56) References Cited

U.S. PATENT DOCUMENTS

| | | | | |
|---|---|---|---|---|
| 4,611,539 | A * | 9/1986 | Ireton | 101/401.1 |
| 4,748,911 | A * | 6/1988 | Kobler | 101/378 |
| 5,156,091 | A * | 10/1992 | Batz | 101/415.1 |
| 5,186,108 | A * | 2/1993 | Hillebrand | 101/415.1 |
| 5,379,694 | A * | 1/1995 | Hajek et al. | 101/415.1 |
| 6,382,103 | B1 * | 5/2002 | Rauh | 101/415.1 |
| 6,443,065 | B1 | 9/2002 | Charette et al. | |
| 6,463,854 | B1 * | 10/2002 | Rautert et al. | 101/481 |
| 6,604,465 | B2 | 8/2003 | Tice et al. | |
| 6,732,650 | B2 * | 5/2004 | Rauh | 101/415.1 |
| 6,810,808 | B1 | 11/2004 | Wallace et al. | |
| 2003/0101886 | A1 | 6/2003 | Rauh | |

OTHER PUBLICATIONS

"How to use the retractable pin in the letterpress drum", Esko Artwork, Kortrijksesteenweg 1095, Gent, BE-9051, Belgium, Sep. 1, 2008.
"Gallus pins: How to handle the gallus pins", Esko Artwork, Kortrijksesteenweg 1095, Gent, BE-9051, Belgium, Jan. 19, 2010.

\* cited by examiner

*Primary Examiner* — Ren Yan
(74) *Attorney, Agent, or Firm* — Dov Rosenfeld; Inventek

(57) ABSTRACT

An apparatus and method for positioning and aligning one or more pre-punched printing plates on a cylinder for imaging a plate in a computer-to-plate drum imaging device. The apparatus includes an imaging cylinder and a registration device connectable to the cylinder. The apparatus includes at least one groove and one pair of register pins, with a first register pin in a fixed position, and a second register pin movable in the groove to a second position, and collinear with the first register pin in the axial direction of the cylinder, arranged such that when connected to the cylinder, the registration device allows a plurality of pre-punched printing plates with variable widths to be positioned and aligned on the cylinder with simplicity.

20 Claims, 7 Drawing Sheets

METHOD AND APPARATUS TO POSITION AND ALIGN PRE-PUNCHED PRINTING PLATES ON AN IMAGING CYLINDER

RELATED PATENT APPLICATIONS

This invention claims benefit of U.S. Provisional Patent Application No. 61/639,694 to inventor Koberg, filed 27 Apr. 2012, and titled "METHOD AND APPARATUS TO POSITION AND ALIGN PRE-PUNCHED PRINTING PLATES ON AN IMAGING CYLINDER," the contents of which are incorporated herein by reference

FIELD OF THE INVENTION

The present disclosure relates generally to the field of printing.

BACKGROUND

Computer-to-plate (CTP) is an imaging technology used in printing processes, in which image data is output directly from a computer to a printing plate by exposing the printing plate to light energy according to the image data. A printing plate, such as a polymer plate covered by a thin ablatable layer is positioned on an imaging cylinder, e.g., the cylinder (also called drum) of an external drum imaging device. As the cylinder rotates around its axis, an image head moves in the axial direction and focuses one or more laser beams modulated with image data on to the plate's ablatable surface to ablate a pattern.

The process of positioning and aligning one or more printing plates on a cylinder is referred to as registration.

Pre-punched plates are used to allow accurate positioning and alignment on a cylinder. A pre-punched plate has registration holes, e.g., two holes punched near one edge of the plate that match register pins on the cylinder to secure alignment. Because the distance between two holes of a pre-punched plate varies depending on the width of the plate, there is a need to accommodate pairs of register pins that are spaced differently for different width plates.

DESCRIPTION OF EXAMPLE EMBODIMENTS

Overview

Figure 1A:
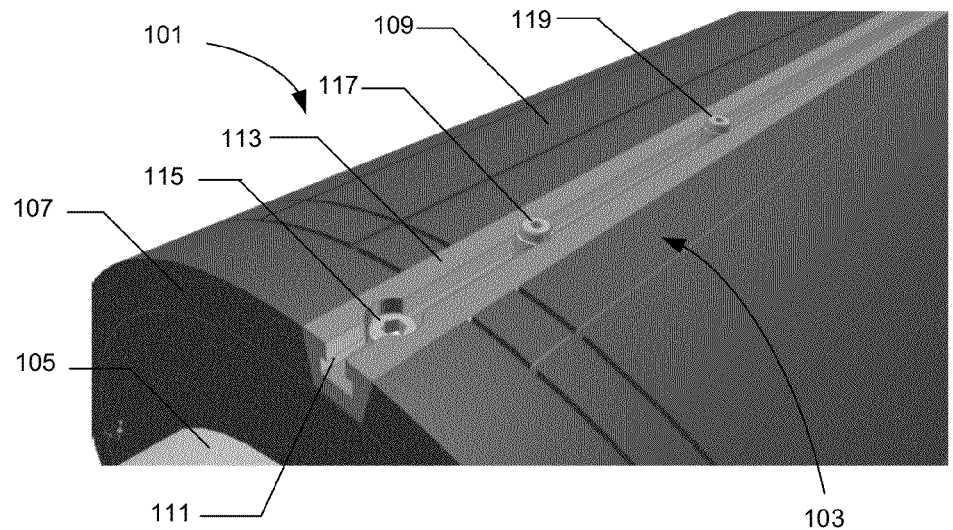
FIG. 1A shows a perspective view of a cylinder and a registration device connected to the cylinder, according to one embodiment of the present invention. Note that the terms drum and cylinder are used interchangeably in this specification. The registration device has a groove formed by a register bar and a pair of register pins including a first register pin having a fixed position and a second register pin having a variable position in the groove.

Described herein are an apparatus and method for positioning and aligning one or more pre-punched printing plates on a cylinder for imaging a plate in a computer-to-plate drum imaging device. The apparatus includes an imaging cylinder and a registration device connectable to the cylinder. The apparatus includes at least one groove and one pair of register pins, with a first register pin in a fixed position, and a second register pin movable in the groove to a second position, and collinear with the first register in the axial direction of the cylinder, arranged such that when connected to the cylinder, the registration device allows a plurality of pre-punched printing plates with variable widths to be positioned and aligned on the cylinder with simplicity.

Particular embodiments include an apparatus comprising an imaging cylinder for a computer-to-plate imaging device, the cylinder being rotatable around an axis, the rotation defining a circumferential direction, the axis defining an axial direction, the cylinder having a base body and an outer surface, and a registration device connectable to the base body of the cylinder and when connected having an outer surface forming part of the outer-surface of the cylinder. The registration device is arranged to position and align one or more pre-punched printing plates on the outer surface of the cylinder. The registration device when connected includes: a groove extending axially on the outer surface of the cylinder, and forming a gap on the outer surface of the cylinder, a first register pin having a fixed position on the base body of the cylinder, and a second register pin movable in the groove and after being moved to a next position on the base body of the cylinder, being fixable to the next position, wherein the first register pin is insertable into a first hole of a printing plate to provide a starting point for the plate, and wherein the second register pin is insertable into a second hole of the plate, the second hole being at a plate position dependent on the width of the plate and defining, when the first register pin is inserted into the first hole and connected to the fixed position, a second position in the axial direction on the outer surface of the cylinder, the second register pin being insertable into the second hole after being moved to the second position, and being fixable to the second position to position the plate on the outer surface of the cylinder.

In one embodiment, the groove may be formed by a register bar that is connected into the base body of the cylinder. In another embodiment, the groove may be created directly on the base body of the cylinder without using a register bar.

In some embodiments, the registration device may include a plurality of the grooves and a plurality of pairs of the first and second register pins to allow multiple printing plates to be aligned on the cylinder and operated at the same time.

Particular embodiments include a method comprising arranging one or more pre-punched printing plates on an imaging cylinder for a computer-to-plate imaging device, the cylinder being rotatable around an axis, the axis defining an axial direction, the cylinder having a base body and an outer surface. The method comprises, for each of the plates, inserting a first register pin into a first hole of the plate, the first register pin having a first position on the base body of the cylinder, the first position being a fixed position providing a starting point for the plate; moving a second register pin to a second position on the base body of the cylinder, the second register pin being movable in a groove extending axially on the outer surface of the cylinder, the second position being in the groove and being determined by the position on the plate of a second hole; inserting the second register pin into the second hole of the plate; and fixing the second register pin into the second position, such that when the first register pins are fixed into the respective positions, the plate is positioned on the outer surface of the cylinder.

Particular embodiments also include a method comprising preparing a groove on an imaging cylinder for a computer-to-plate imaging device, the cylinder being rotatable around an axis, the axis defining an axial direction, the cylinder having a base body and an outer surface, the groove extending axially on the outer surface of the cylinder, and forming a gap on the outer surface of the cylinder; preparing a first register pin having a fixed position on the base body of the cylinder, the first register pin being insertable into a first hole of a printing plate to provide a starting point for the plate; and preparing a second register pin movable in the groove, the second register pin being insertable into a second hole of the plate at a plate position dependent on the width of the plate and defining, when the first register pin is inserted into the first hole and connected to the fixed position, a second position in the axial direction on the outer surface of the cylinder, the second register pin being insertable into the second hole after the second register pin is moved to the second position and fixed to the second position to position the plate on the outer surface of the cylinder.

Particular embodiments may provide all, some, or none of these aspects, features, or advantages. Particular embodiments may provide one or more other aspects, features, or advantages, one or more of which may be readily apparent to a person skilled in the art from the drawings, descriptions, and claims herein.

Example Embodiment(S)

Figure 1B:
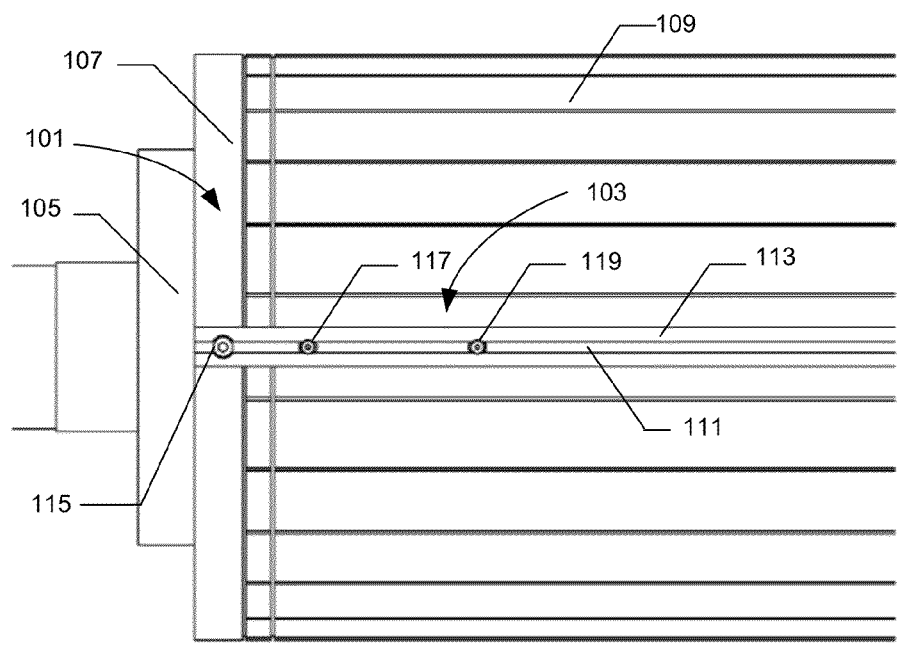
FIG. 1B shows an overhead view of the cylinder and the registration device shown in FIG. 1A.

FIGS. 1A and 1B show a perspective view and an overhead view, respectively, of an apparatus that includes an embodiment of the present invention. The apparatus includes an imaging cylinder 101 and a registration device 103. The cylinder 101 is, for example, the cylinder of an external drum imaging device for imaging flexographic plates. The cylinder 101 has an axis 105, which defines an axial direction, and is rotatable around the axis 105. The rotation defines a circumferential direction. The cylinder 101 includes a base body 107 and an outer surface 109.

The registration device 103 includes a groove 111 that extends axially on the base body 107. The groove 111 forms part of the outer surface 109 of the cylinder 101 and causes a gap on the outer surface 109. In one embodiment, the groove 111 is formed by a register bar 113 that is connected into the base body 107. The connection is made using a bolt 115. In other embodiments, the register bar 113 may be connected by using one or more bolts in different ways or by other means such as by gluing the register bar 113 to the base body 107. Also in other embodiments, rather than having the register bar 113 forming the groove 111, the groove 111 may be created directly on the base body 107 of the cylinder 101.

The registration device 103 also includes a pair of register pins consisting of a first register pin 117 and a second register pin 119. The first register pin 117 is insertable into a first registration hole punched on a printing plate, and has a fixed position on the base body 107. In one embodiment, the groove 111 extends from one end of the base body 107 to the other end, and the fixed position is a fixed position in the axial direction in the groove 111. In another embodiment, the groove 111 extends only partially on the base body 107. In another variant embodiment, the fixed position is outside of the groove 111 and collinear therewith in the axial direction. The second register pin 119 is collinear with the first register pin 117 in the axial direction, and is moveable in the groove 111 to a second position at an axial distance from the first register pin 117 that matches the distance between the first hole and a second hole in the printing plate, so that the second register pin 119 can be inserted into the second registration hole. The second register pin 119 is fixable at the second position.

While FIGS. 1A and 1B show only one registration device 103, there may be more than one registration device 103 connected to the base body 107 of the cylinder 101, at different circumferential locations of the cylinder 101. Having multiple registration devices on a cylinder can effectively increase the usability of the cylinder for different sizes of pre-punched printing plates.

Figure 2A:
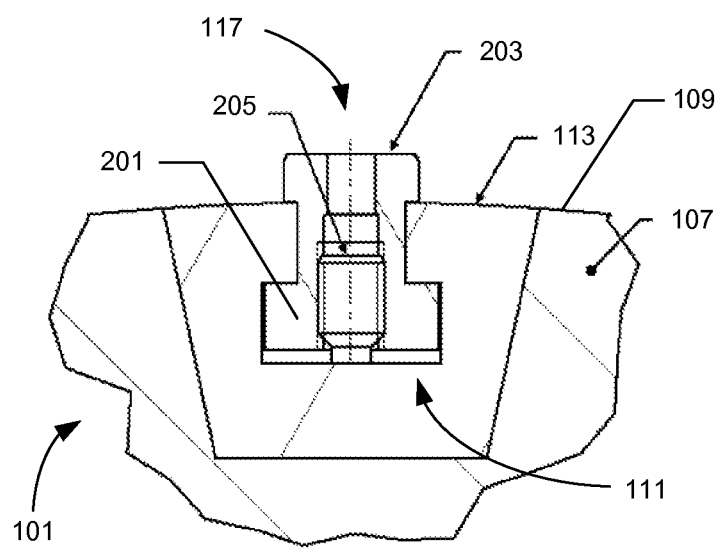
FIG. 2A shows a cross-sectional view of the groove, the register bar, and the first register pin included in the registration device shown in FIGS. 1A and 1B.

FIG. 2A shows a cross-sectional view of the groove 111, the register bar 113, and the first register pin 117 included in the registration device 103. The groove 111, formed by the register bar 113, has a reverse T-shaped cross-section. The first register pin 117, which has a fixed position, is in the groove 111. In one embodiment, the register pin 117 includes a base 201 that is connected into the register bar 113, which in turn is connected into the base body 107 of the cylinder. The register pin 117 also includes a cap 203 that interacts with the base 201 and rises from the base 201 to above the outer surface 109 of the cylinder 101. The base 201 is fixed into the register bar 113 using a lock screw 205, thus providing the fixed position for the register pin 117. The cap 203 is separable from the base 201 for inserting the pin 117 into a registration hole of a printing plate and connecting the plate onto the outer surface 109 of the cylinder 101.

Although not shown in the drawing, in one embodiment, the second register pin 119 may also include a base and a cap, similar to the base 201 and the cap 203 of the first register pin 117. However, instead of being fixed into the register bar 113 or the base body 107 of the cylinder 101, the base of the second register pin 119 is movable in the groove 111 to provide a variable position for the second register pin 119. Similar to the cap 203 shown in FIG. 2A, the cap of the second register pin 119 also interacts with the base of the pin 119 and rises from the base to above the outer surface 109 of the cylinder 101, and also is separable from the base for inserting the pin 119 into a registration hole of a printing plate.

Therefore, when both caps of the register pins 117 and 119 are separated from their respective bases and connected back to the respective bases after the pins 117 and 119 are inserted into a first and a second hole of a printing plate, respectively, the plate can be positioned on the outer surface 109 of the cylinder 101.

While in one embodiment, the first register pin 117 and the second register pin 119 include base and cap components, in other embodiments, either the first register pin 117 or the second register pin 119 or both may have more or fewer components, but provide the same functionalities. In one such alternate embodiment, the first register pin 117 directly interacts with a threaded pin hole on the register bar 113 or on the base body 107 without going through a base.

Figure 2B:
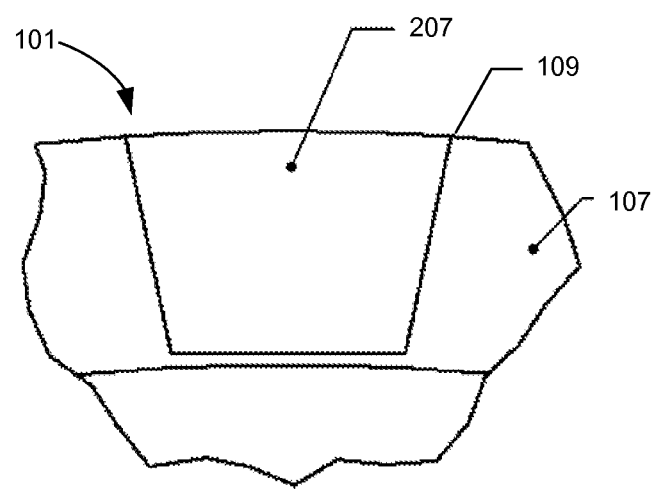
FIG. 2B shows another cross-sectional view of the cylinder wherein the register bar is removed from the cylinder and replaced with a bar having no groove.

For situations in which the groove 111 is not needed, it may be desirable to close the gap on the base body 107 formed by the groove 111. FIG. 2B shows one embodiment according to which the register bar 113 is removable from the base body 107. For example, the register bar 113 that is connected into the base body 107 using a bolt 115 as shown in FIG. 1A and FIG. 1B, may be removed and replaced by a bar 207 that has no groove to close the gap on the base body 107.

Figure 3:
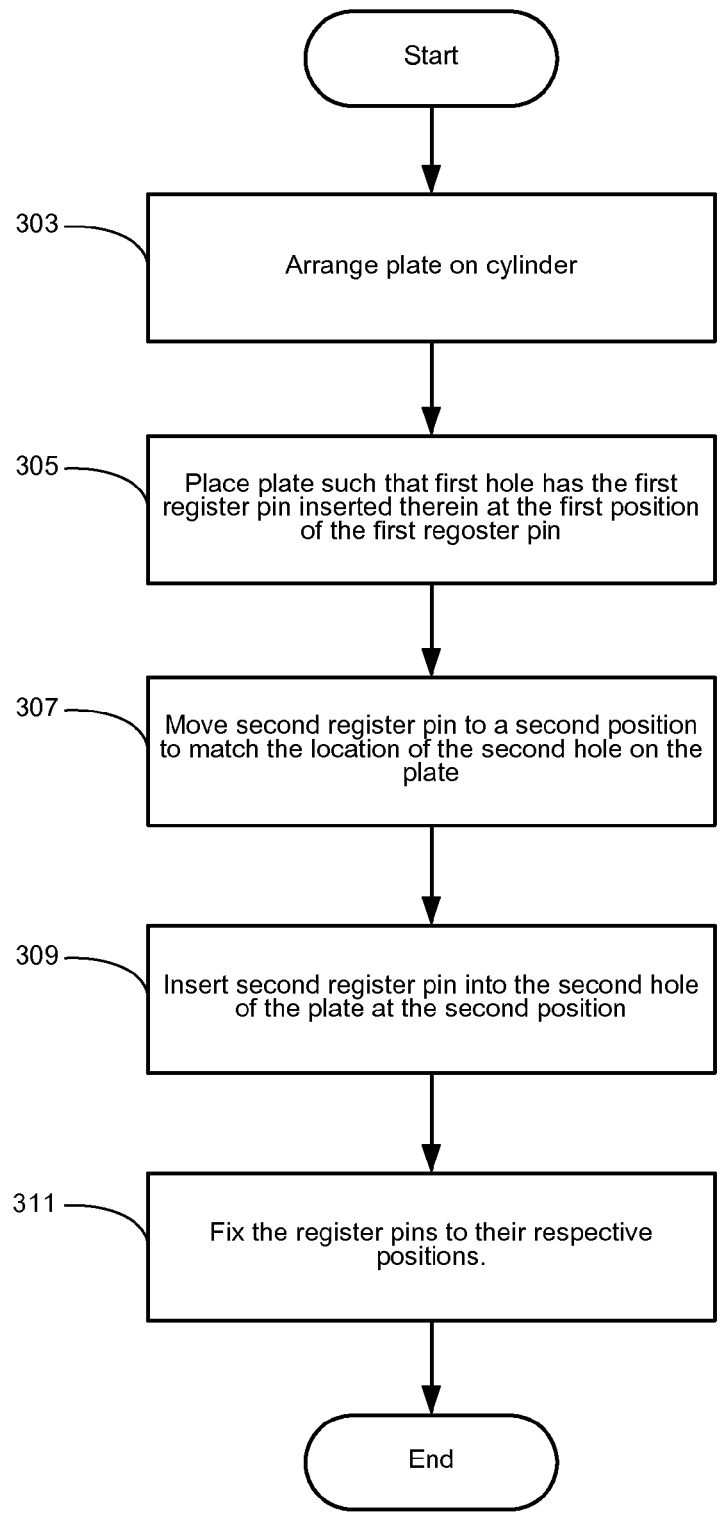
FIG. 3 shows a flowchart of a method for positioning a pre-punched printing plate on a cylinder according to one embodiment of the present invention.

FIG. 3 shows a flowchart of one embodiment of a method in the present invention for positioning a pre-punched printing plate on a cylinder, using a registration device as described above. The plate has at least a pair of registration holes: a first hole and a second hole. In 303, the plate is arranged on the cylinder. 305 includes placing the plate such that the first hole of the plate has the first fixed register pin of the registration device inserted therein at the fixed position on the cylinder for the first register pin. In 307 the second register pin of the registration device, which is movable in the groove of the registration device, is moved to a second position that matches the location of the second hole of the plate. In 309, the second register pin at the second position is inserted into the second hole. In 311, the second register pin is fixed in the second position, and the whole of the edge of plate is therefore securely positioned on the outer surface of the cylinder.

Some embodiments include multiple pairs of register pins, collinear in the axial direction, each pair including a fixed register pin and a second movable register pin, so that a plurality of plates possible with different widths may be registered at the same time on the printing cylinder.

Returning to the flowchart of FIG. 3, repeating the steps 303 to 311, using a plurality of pairs of the first and second register pins, multiple pre-punched printing plates with variable widths can be positioned on a cylinder. The first register pins are at respective fixed positions on the base body, providing separate starting points for the plates. In one version, there is a single groove for all movable second register pins such that the second register pins are each movable in the same groove. In an alternate embodiment there is a separate respective groove in which a respective second register pin is movable. In both such embodiments, the second register pins are moved to their respective second positions determined by respective locations of second holes in the different plates, which are at plate positions dependent on the widths of the plates. All the pin positions are collinear in the axial direction of the cylinder, such that when all the first and second pins are fixed into their respective positions, the plates are positioned and aligned on the outer surface of the cylinder. The plates can be used thereafter for printing in a computer-to-plate imaging device at the same time.

Figure 4A:
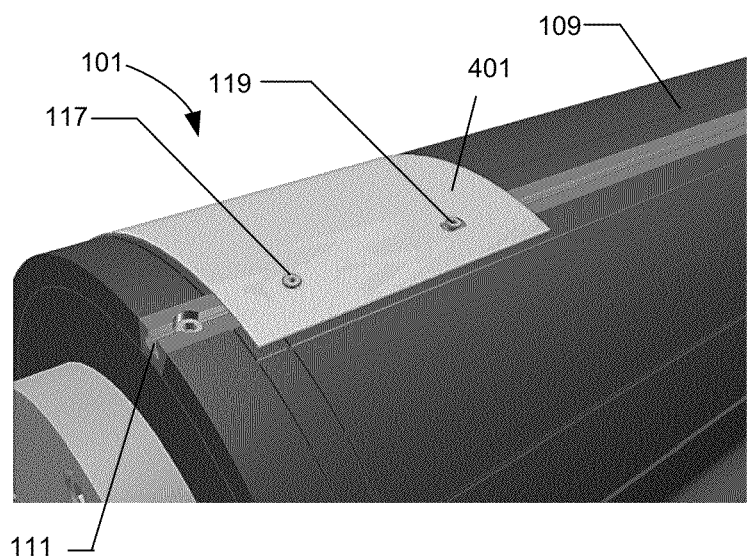
FIG. 4A shows a pre-punched printing plate positioned on a cylinder that includes an embodiment of the present invention.

FIG. 4A shows an example of a pre-punched printing plate 401 positioned on the cylinder 101 with one apparatus embodiment of the present invention. The first register pin 117 is inserted into the first hole of the plate 401 to provide a first location for the plate 401 and connected into the fixed position on the base body 107. The second register pin 119 is then moved to a second position in the axial direction in the groove 111, such second position determined by the location of second hole of the plate 401 dependent on the width of the plate 401. The second register pin 119 is then inserted into the second hole. When the first register pin 117 and the second register pin 119 are fixed into their respective positions, the plate 401 is positioned on the outer surface 109 of the cylinder 101.

Figure 4B:
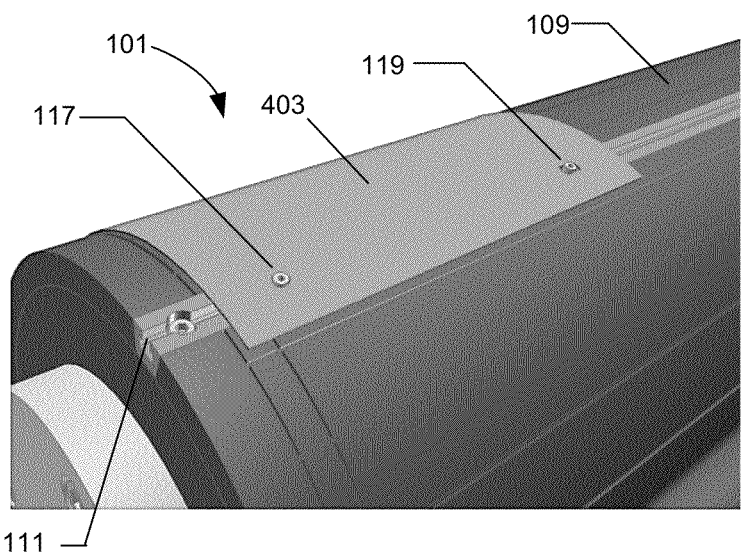
FIG. 4B shows another pre-punched printing plate positioned on a cylinder that includes an embodiment of the present invention, with the plate having a different width than the plate shown in FIG. 4A.

FIG. 4B shows a pre-punched printing plate 403, which has a different width than the plate 401, positioned on the outer surface 109 of the cylinder 101 using the first register pin 117 and the second register pin 119 in combination. The plate 403 has the same starting point on the outer surface 109 as the plate 401, as determined by the first register pin 117 and its fixed position, e.g., in the groove 111. The second register pin 119, however, is moved to a second position in the groove 111 that is different from the counterpart second position for the plate 401, due to the larger distance between the two registration holes of the plate 403.

Figure 5:
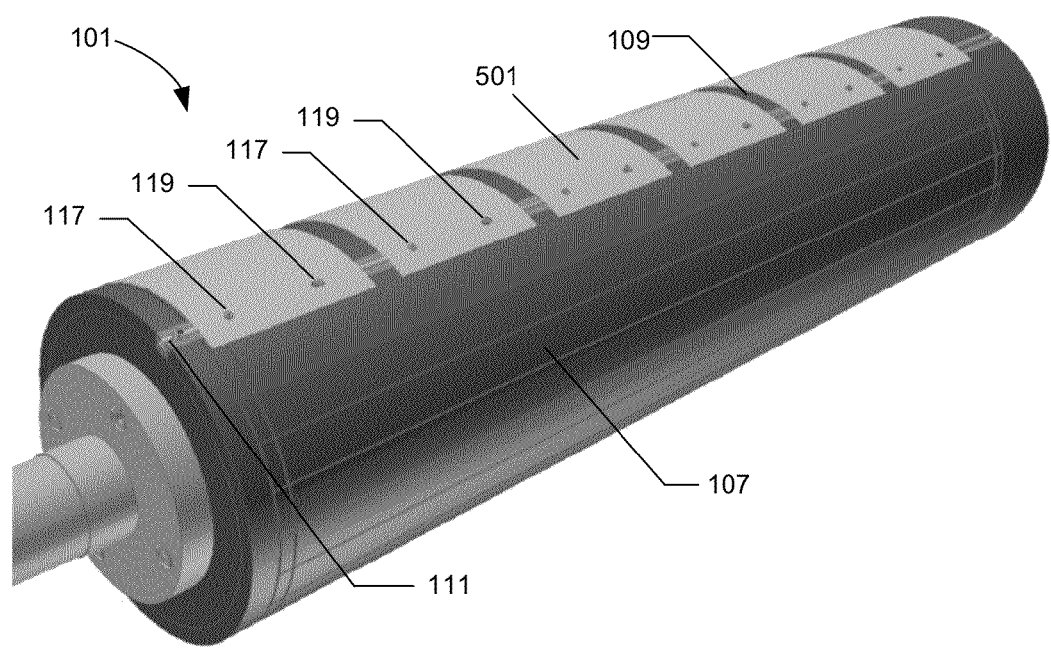
FIG. 5 shows a plurality of pre-punched printing plates positioned and aligned on a cylinder that includes an embodiment of the present invention.

FIG. 5 shows a plurality of pre-punched printing plates 501 positioned and aligned on the outer surface 109 of the cylinder 101. Each plate 501 is positioned on the cylinder 101 using a pair of a respective first register pin 117 and a second register pin 119. Each of the first register pins 117 has a fixed position on the cylinder 101, with a pre-defined distance between adjacent first register pins. In one embodiment, the first register pins are removable. In an alternate embodiment, there are several pre-defined locations for at least one of the first register pins so that different respective locations for the first register pins can be used. Each first register pin 117 has one corresponding second register pin 119 located in between two adjacent first register pins 117. Before being inserted into the respective second holes of the respective plates, each second register pin 119 is movable in the groove 111 between its corresponding two adjacent first register pins 117. All the register pins 117 and 119 are in the groove 111, and therefore are aligned along the axial direction of the cylinder 101. Thus plates 501 are aligned and can be used in printing in a computer-to-plate imaging device at the same time.

In the example shown in FIG. 5, the plates 501 appear as having the same width. This however is not necessary. Plates of different widths, and therefore different inter-distances between registration holes, and be positioned and aligned on the cylinder 101. A plate may also have a width that is larger than any distance between two adjacent fixed register pins 117 shown in FIG. 5. The only limitation is that the sum of the widths of the plates, plus any necessary gaps between adjacent plates as required by a printing operation, be in accordance with the axial length of the base body 107 of the cylinder 101. Depending on the number of plates to be mounted on the cylinder 101, more or fewer pairs of first and second register pins 117 and 119 can be used. In particular, when fewer register pins 117 and 119 are to be used, according to the embodiment shown in FIG. 2A, any unused first and second register pins are removed from the groove 111, in order to give space to a wider plate.

One embodiment includes several locations in which first (fixed-position) register pins may be placed and from which such first register pins may be removed.

Figure 6A:
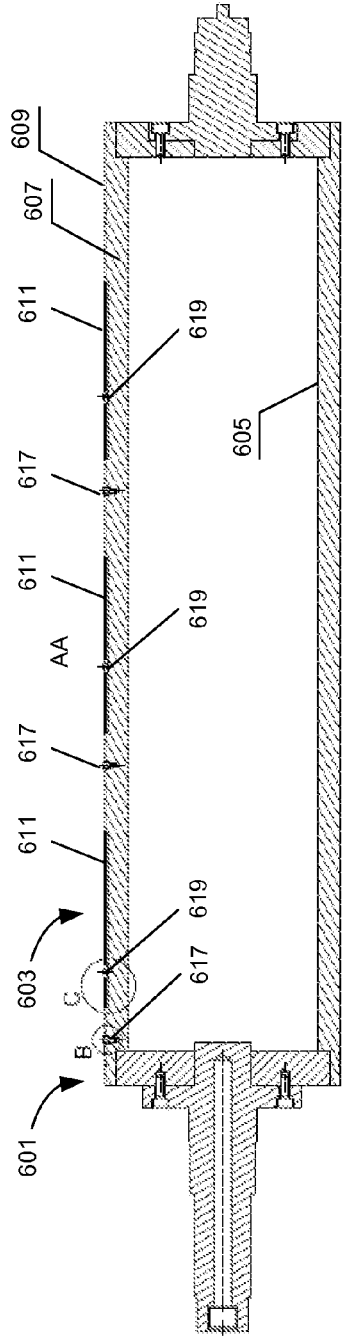
FIG. 6A shows a longitudinal cross-sectional view of a cylinder and a registration device connected to the cylinder according to an alternative embodiment of the present invention. The registration device includes a plurality of grooves and a plurality of pairs of register pins. Each pair of register pins includes a first register pin having a fixed position and a second register pin having a variable position.
Figure 6B:
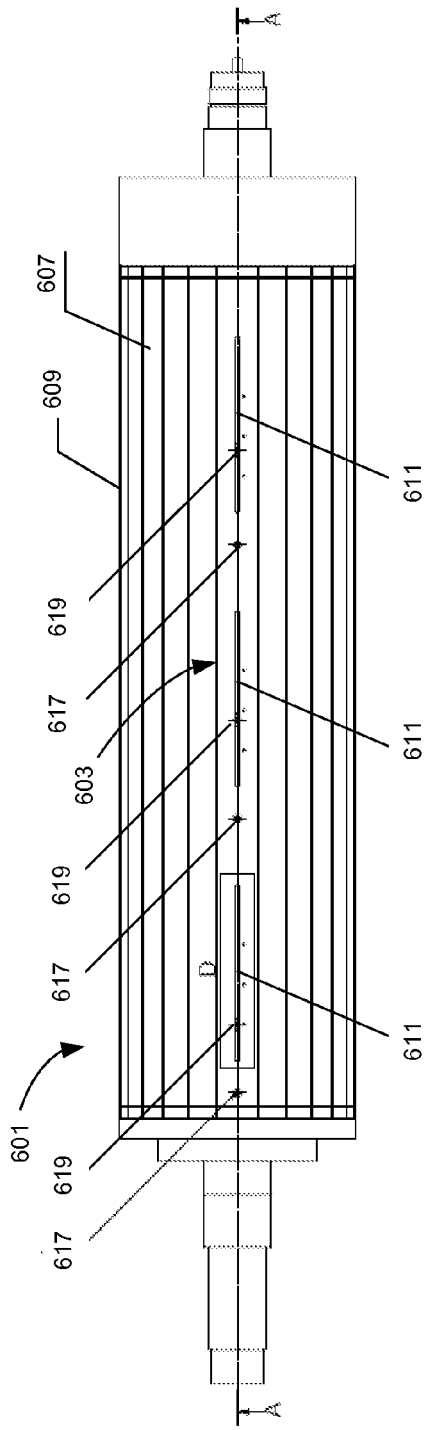
FIG. 6B shows an overhead view of the cylinder and the registration device shown in FIG. 6A.

FIGS. 6A and 6B show an alternative embodiment of an apparatus according to the present invention to position and align multiple pre-punched printing plates, such as the plates 501 shown in FIG. 5. FIG. 6A shows a longitudinal cross-section of the drum marked AA in FIG. 6B, and FIG. 6B shows an overhead view of the drum. The apparatus includes a cylinder 601 that may be the same as the cylinder 101 shown in FIGS. 1A and 1B, and a registration device 603 that is similar to the registration device 103 but with some differences. The cylinder 601 has a base body 607 that has an inner surface 605 and an outer surface 609. The registration device 603 includes a plurality of grooves 611, a plurality of pairs of register pins, each pair including a first register pin 617 having a respective fixed position, and a second register pin 619 movable in a respective groove 611. Each first register pin 617, second register pin 619, and groove 611 form a combination. Different from the embodiment shown in FIG. 1A and FIG. 1B, the first register pins 617 are not in the grooves 611 but are attached directly to the base body 607. All the first and second register pins, however, are collinear along the axial direction of the cylinder 601.

Figure 7A:
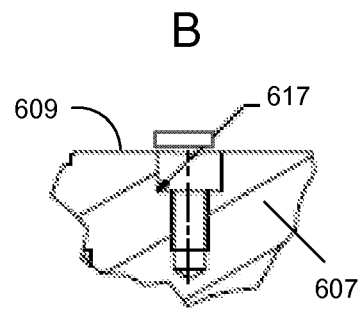
FIG. 7A shows a cross-sectional view of a first register pin shown in FIGS. 6A and 6B.
Figure 7B:
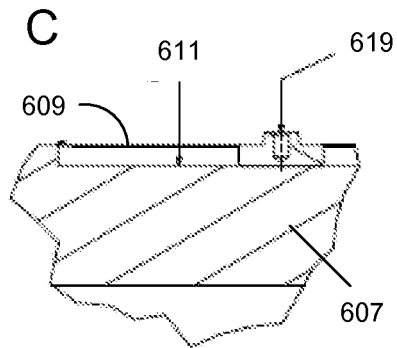
FIG. 7B shows a cross-sectional view of a groove and a second register pin in the groove shown in FIGS. 6A and 6B.
Figure 7C:
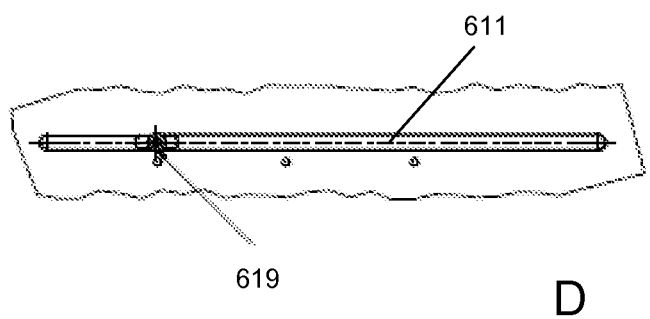
FIG. 7C shows a top view of one f the grooves shown in FIGS. 6A and 6B.

FIGS. 7A, 7B, and 7C show closer views of a first register pin 617, a second register pin 619, and a groove 611, respectively, according to the embodiment shown in FIGS. 6A and 6B. In a cross-sectional view in FIG. 7A, the first register pin 617 is shown in a fixed position on the base body 607, and rises above the outer surface 609. The first register pin 617 may be fixed into the position through interaction with a threaded register pin hole prepared on the base body 607. In a cross-sectional view in FIG. 7B, the second register pin 619 is shown residing in the groove 611, and rises above the outer surface 609. Unlike the groove 111 shown in FIGS. 1A and 1B, which is formed by a register bar 113 therein and has a reverse T-shaped cross-section, the groove 611 is created directly on the base body 607 and has a flat shape cross-section. Nevertheless, as shown in an overhead view in FIG. 7C, the groove 611 also allows the second register pin 619 to be movable along the axial direction in the groove 611, and to be fixable to a second position in the groove 611 after the second register pin 619 is moved to the second position.

The elements associated with the apparatus, and the steps associated with the method of the present disclosure may vary widely. Elements and steps may be added, removed, altered, combined, and reordered without departing from the spirit of the scope of the present disclosure. Therefore, the present examples are to be considered as illustrative and not restrictive, and the examples are not to be limited to the details given herein, but may be modified within the scope of the appended claims.

I claim:

1. An apparatus comprising:
    an imaging cylinder for a computer-to-plate imaging device, the cylinder being rotatable around an axis, the rotation defining a circumferential direction, the axis defining an axial direction, the cylinder having a base body and an outer surface; and
    a registration device connectable to the base body of the cylinder and when connected having an outer surface forming part of the outer-surface of the cylinder, the registration device arranged to position and align one or more pre-punched printing plates on the outer surface of the cylinder,
    wherein the registration device when connected includes:
    a groove extending axially on the outer surface of the cylinder, and forming a gap on the outer surface of the cylinder,
    a first register pin having a fixed position on the base body of the cylinder, and
    a second register pin movable in the groove and after being moved to a next position on the base body of the cylinder, being fixable to the next position,
    wherein the first register pin is insertable into a first hole of a printing plate to provide a starting point for the plate, and
    wherein the second register pin is insertable into a second hole of the plate when the first register pin is inserted into the first hole, the second hole being at a plate position dependent on the width of the plate and defining, when the first register pin is inserted into the first hole and connected to the fixed position, a second position in the axial direction on the outer surface of the cylinder, the second register pin being insertable into the second hole after being moved to the second position, and being fixable to the second position to position the plate on the outer surface of the cylinder.

2. An apparatus as recited in claim 1, wherein the groove has a reverse T-shaped cross-section.

3. An apparatus as recited in claim 1, wherein the fixed position is a position in the axial direction in the groove.

4. An apparatus as recited in claim 3, wherein the first register pin is fixed into the groove using a lock screw.

5. An apparatus as recited in claim 1, wherein the first register pin and the second register pin in combination can position and align printing plates of different widths on the outer surface of the cylinder.

6. An apparatus as recited in claim 1, wherein the registration device includes a plurality of pairs of register pins, each pair including a first register pin having a fixed position on the outer surface of the cylinder and a second register pin being movable in the groove to provide a variable position on the outer surface, all the fixed and variable positions being collinear along the axial direction, such that a plurality of pre-punched printing plates can be positioned and aligned on the outer surface of the cylinder for operating the imaging device while the plurality of plates are on the outer surface of the cylinder at the same time.

7. An apparatus as recited in claim 6, wherein the registration device includes a plurality of grooves, and wherein there is at least one pair of register pins in each groove.

8. An apparatus as recited in claim 1, further comprising at least one registration device arranged at a different circumferential location of the cylinder.

9. An apparatus as recited in claim 1, wherein the groove is formed by a register bar that is connected into the base body of the cylinder.

10. An apparatus as recited in claim 9, wherein the register bar can be replaced with a bar having no groove to close the gap on the outer surface of the cylinder.

11. A method comprising:
    arranging one or more pre-punched printing plates on an imaging cylinder for a computer-to-plate imaging device, the cylinder being rotatable around an axis, the axis defining an axial direction, the cylinder having a base body and an outer surface; for each of the plates,
    inserting a first register pin into a first hole of the plate, the first register pin having a first position on the base body of the cylinder, the first position being a fixed position providing a starting point for the plate;
    connecting the first register pin to the fixed position;
    moving a second register pin to a second position on the base body of the cylinder, the second register pin being movable in a groove extending axially on the outer surface of the cylinder, the second position being in the groove and being determined by a second hole of the plate after the first register pin is inserted into the first hole and connected to the fixed position, the second hole being at a plate position dependent on the width of the plate;
    inserting the second register pin into the second hole of the plate and connecting the second register pin to the second position; and
    fixing the first register pin into the first position and the second register pin into the second position;

such that when the first register pin and the second register pin are fixed into the respective positions, the plate is positioned on the outer surface of the cylinder.

12. A method as recited in claim 11, wherein the groove has a reverse T-shaped cross-section.

13. A method as recited in claim 11, wherein the fixed position is a position in the axial direction in the groove.

14. A method as recited in claim 11, wherein the first register pin and the second register pin in combination can position and align printing plates of different widths on the outer surface of the cylinder.

15. A method as recited in claim 11, wherein multiple pre-punched printing plates are positioned on the outer surface of the cylinder using a plurality of pairs of register pins, each pair including a first register pin having a fixed position on the outer surface of the cylinder and a second register pin being movable in the groove to provide a variable position on the outer surface, all the fixed and variable positions being collinear along the axial direction, such that the multiple plates are aligned on the outer surface of the cylinder for operating the imaging device while the plates are on the outer surface of the cylinder at the same time.

16. A method as recited in claim 15, wherein the multiple printing plates have same widths.

17. A method as recited in claim 15, wherein at least two printing plates have different widths.

18. A method as recited in claim 15, wherein there is a plurality of grooves, and wherein there is at least one pair of register pins in each groove.

19. A method comprising:
   preparing a groove on an imaging cylinder used in a computer-to-plate imaging device, the cylinder being rotatable around an axis, the axis defining an axial direction, the cylinder having a base body and an outer surface, the groove extending axially on the outer surface of the cylinder, and forming a gap on the outer surface of the cylinder;
   preparing a first register pin at a fixed position on the outer surface of the base body of the imaging cylinder, the first register pin being insertable into a first hole of a printing plate that includes two or more holes, including a second hole, to provide a starting point for the plate; and
   preparing a second register pin that is movable in the groove such that the second register pin location is variable, the second register pin being insertable into the second hole of the plate when the first register pin is inserted into the first hole, the second hole being at a plate position dependent on the width of the plate and defining, when the first register pin is inserted into the first hole and connected to the fixed position, a second position in the axial direction on the outer surface of the cylinder, the second register pin being insertable into the second hole and fixable to the second position after the second pin is moved to the second position on the outer surface to position the plate on the outer surface of the cylinder, such that different plates of varying width may be mounted on the outer surface at a location determined by the first fixed register pins and at least the second register pin.

20. A method as recited in claim 19, wherein the groove is formed by a register bar that is connected into the base body of the cylinder and that includes the groove.

* * * * *